US006927564B2

United States Patent
Arnoux et al.

(10) Patent No.: US 6,927,564 B2
(45) Date of Patent: Aug. 9, 2005

(54) MULTIMETER INSTRUMENT WITH TOUCH-SENSITIVE SELECTION DEVICE

(75) Inventors: Daniel Arnoux, La Baule (FR); Axel Arnoux, Paris (FR); Claude Genter, Neuilly sur Seine (FR)

(73) Assignee: Chauvin Arnoux, Paris (FR)

( * ) Notice: Subject to any disclaimer, the term of this patent is extended or adjusted under 35 U.S.C. 154(b) by 0 days.

(21) Appl. No.: 10/620,799

(22) Filed: Jul. 17, 2003

(65) Prior Publication Data

US 2004/0130330 A1 Jul. 8, 2004

(30) Foreign Application Priority Data

Jul. 18, 2002 (EP) .............................................. 02291817

(51) Int. Cl.[7] ........................ G01R 15/08; G01R 35/04; H01H 31/12; G09G 5/00
(52) U.S. Cl. ........................ 324/141; 324/74; 324/551; 324/99 D; 345/170; 345/173
(58) Field of Search .......................... 324/141, 74, 551, 324/158; 345/173; 702/127

(56) References Cited

U.S. PATENT DOCUMENTS

| 4,821,030 | A | * | 4/1989 | Batson et al. ................ 345/173 |
| 4,825,392 | A | | 4/1989 | Freeman |
| 4,949,274 | A | | 8/1990 | Hollander et al. |
| 5,489,841 | A | * | 2/1996 | Henkelmann ................ 324/115 |
| 6,064,372 | A | * | 5/2000 | Kahkoska .................... 345/173 |
| 6,262,569 | B1 | * | 7/2001 | Carr et al. ..................... 324/74 |
| 6,271,654 | B1 | | 8/2001 | Chen |
| 6,281,673 | B1 | | 8/2001 | Zoellick et al. |
| 6,515,484 | B1 | * | 2/2003 | Bald et al. ................... 324/551 |

FOREIGN PATENT DOCUMENTS

JP            5-060798        7/1993

* cited by examiner

*Primary Examiner*—Vinh Nguyen
*Assistant Examiner*—Emily Y Chan
(74) *Attorney, Agent, or Firm*—Leydig, Voit & Mayer, Ltd.

(57) ABSTRACT

A multimeter instrument for measuring variables, such as electrical current, voltage, or resistance includes touch-sensitive zones for selection of the variable to be measured. The measurement circuit associated with the variable selected with the aid of touch-sensitive selection zones is activated by the zone selected.

15 Claims, 3 Drawing Sheets

MULTIMETER INSTRUMENT WITH TOUCH-SENSITIVE SELECTION DEVICE

FIELD OF THE INVENTION

The invention pertains in general to multimeter instruments, and particularly to portable instruments for the measurement of a plurality of variables, such as the current or voltage of an electrical signal or the electrical resistance of a circuit.

BACKGROUND

Figure 5:
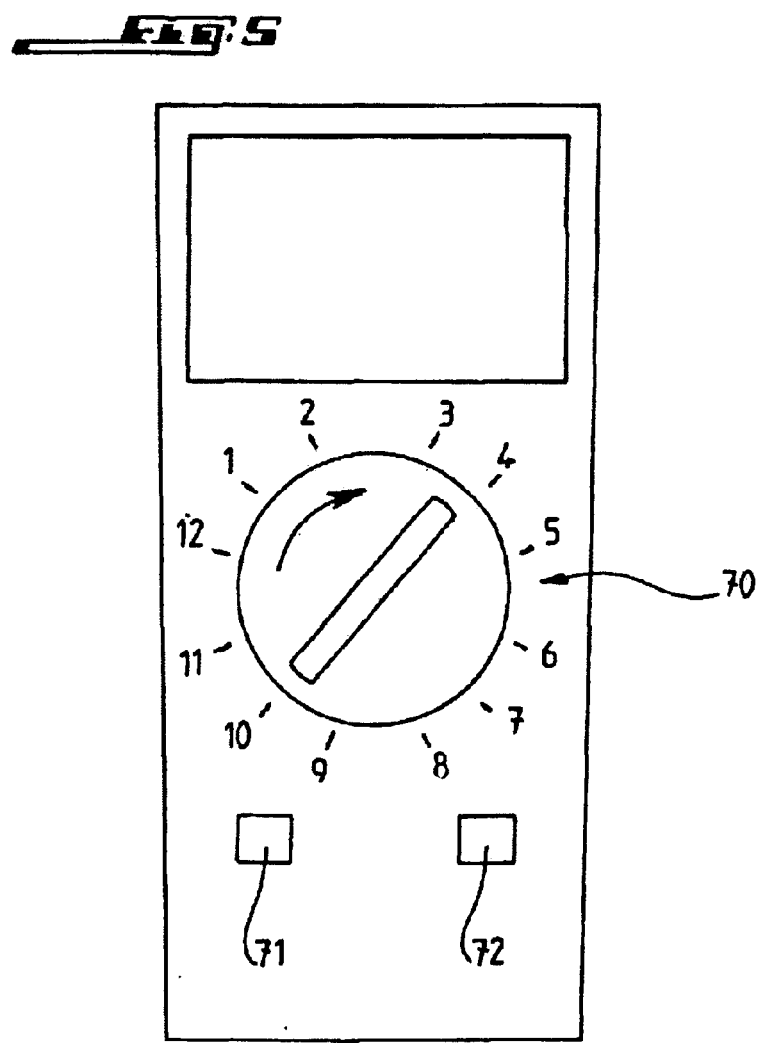

Devices of this type are known in the prior art and are used particularly by electricians. One of these devices is represented in FIG. 5.

The device for selection of the variable to be measured is generally a mechanical rotary selector arranged on the front of the instrument, allowing one to select the variable and, for each variable, the measurement scale.

The rotary selector typically has 11 positions defined by stop notches of the selector, which can be accessed successively by turning the selector in an obligatory direction starting from a stop position.

The quality of this selector is one of the important elements of the multimeter appreciated by the user.

Mechanical rotary selectors wear out quickly under the effect of the movement and friction of the brushes against the electrical contacts. This results in wear and tear on the brushes, the contacts, and the housing in which the selector turns. This combined wear and tear causes, over time, measurement drift due to the effect of resistance of the contacts and to the metal deposits on the printed circuits.

SUMMARY OF THE INVENTION

In this context, the present invention aims to mitigate the above-mentioned defects.

For this purpose, the device of the invention comprises touch-sensitive zones for selection of the variable to be measured, and a means for activating the measuring means associated with the variable selected with the touch-sensitive selection zones.

In a possible embodiment of the invention, the activation means includes a microprocessor, each touch-sensitive selection zone positioning a solid-state or electromechanical relay in order to act on the microprocessor.

Advantageously, the instrument can comprise a plurality of input sockets, and the activation means can comprise a switching circuit connecting the input sockets to the measuring means and whose configuration is controlled by the microprocessor as a function of the commands received in the touch-sensitive selection zones.

For example, the variables can be subdivided into several families, the touch-sensitive selection zones comprising touch-sensitive family zones allowing one to select a family of variables, and touch-sensitive menu zones allowing one to select a variable within a family.

Preferably, the instrument can have a means for measuring the electrical current, a plurality of input sockets including an Ampères input socket used at least when the means for measuring the current is selected, a measurement cord selectively connected by a connecting end to one of the sockets, and a means for detecting the connection of the connecting end of the cord to the Ampères input socket.

Advantageously, the Ampères input socket can have two half-sockets electrically isolated from one another, the connecting end of the cord including a plug that short-circuits the two half-sockets when the connecting end of the cord is connected to the Ampères input socket, the detection means detecting the short-circuiting of the two half-sockets.

For example, the activating means can automatically activate the means for measuring the current provided that the detection means detects the connection of the connecting end of the cord to the Ampères input socket, and that the current was selected with the aid of the device for selecting the variable to be measured.

Preferably, one of the two half-sockets of the Ampères input socket can be electrically connected to a reference input socket via a main fuse and a secondary fuse in series, the secondary fuse being destroyed at a voltage at least twice as small as the main fuse.

Advantageously, the touch-sensitive family zones can be arranged in a circle.

For example, the instrument can comprise light indicators arranged in a circle in the vicinity of the touch-sensitive family zones, indicating the family to which the active measurement means belongs.

BRIEF DESCRIPTION OF DRAWINGS FIGURES

Figure 1:
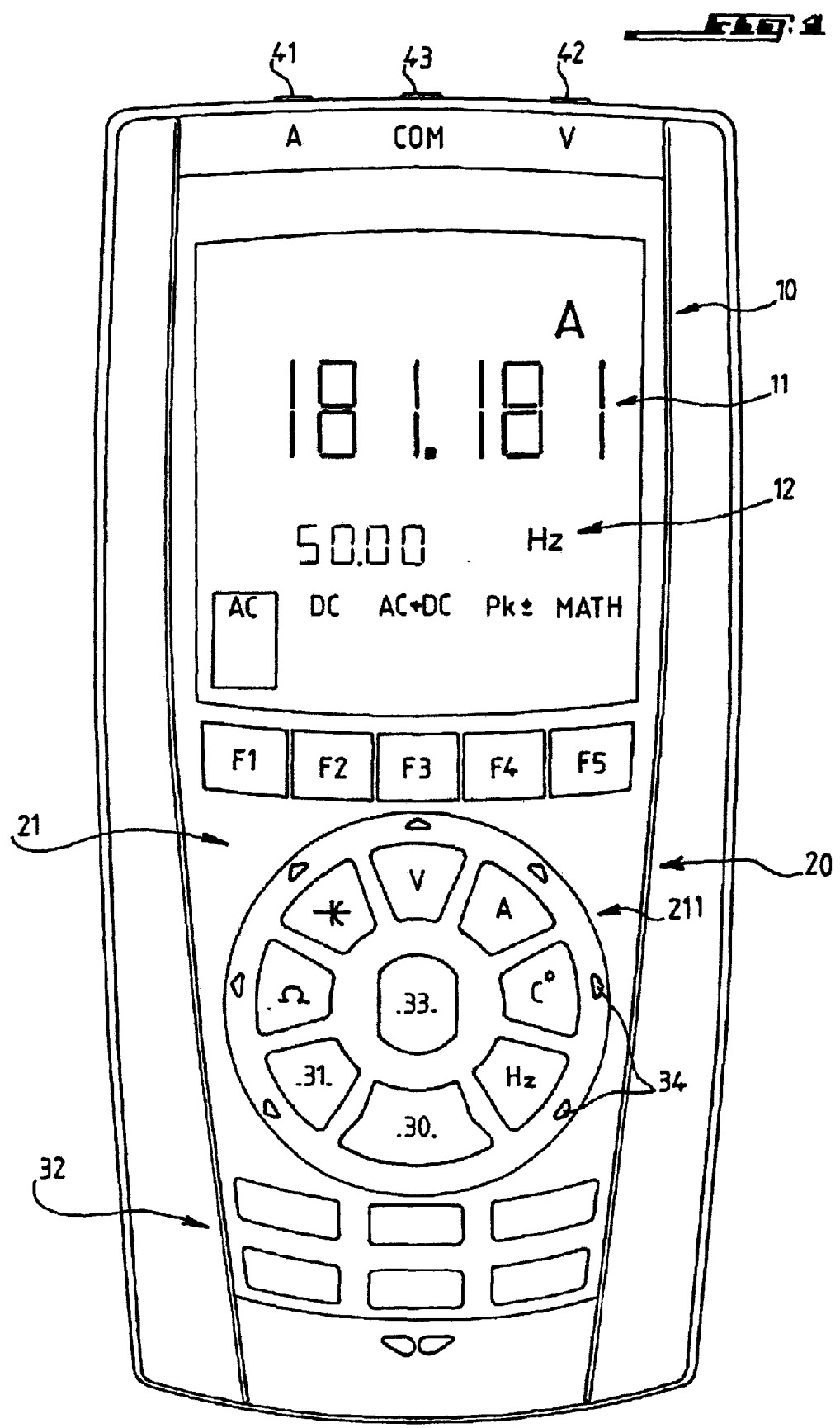
Figure 2:
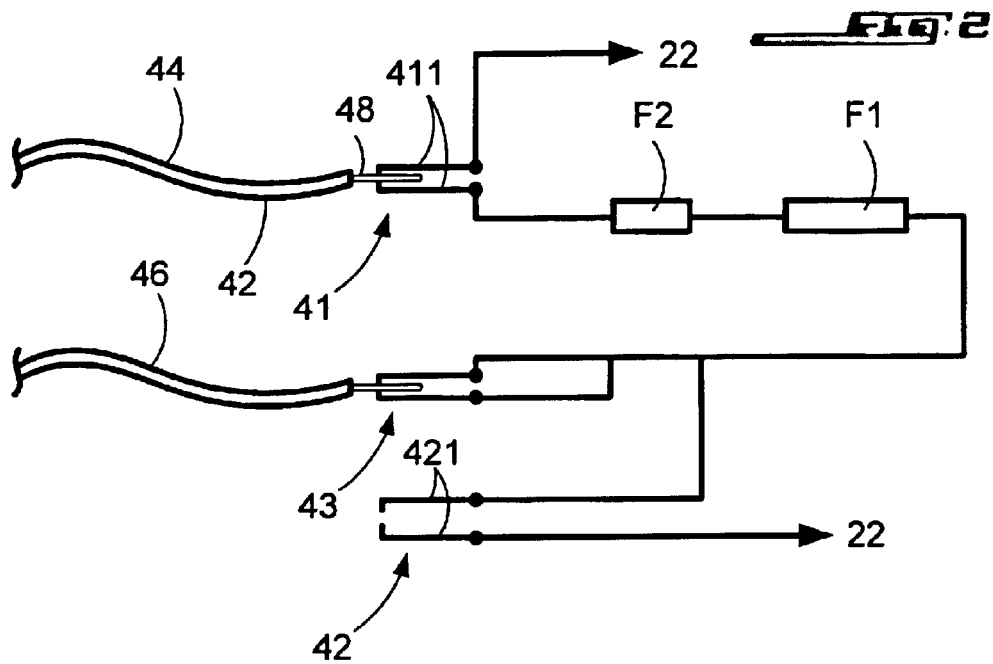
Figure 3:
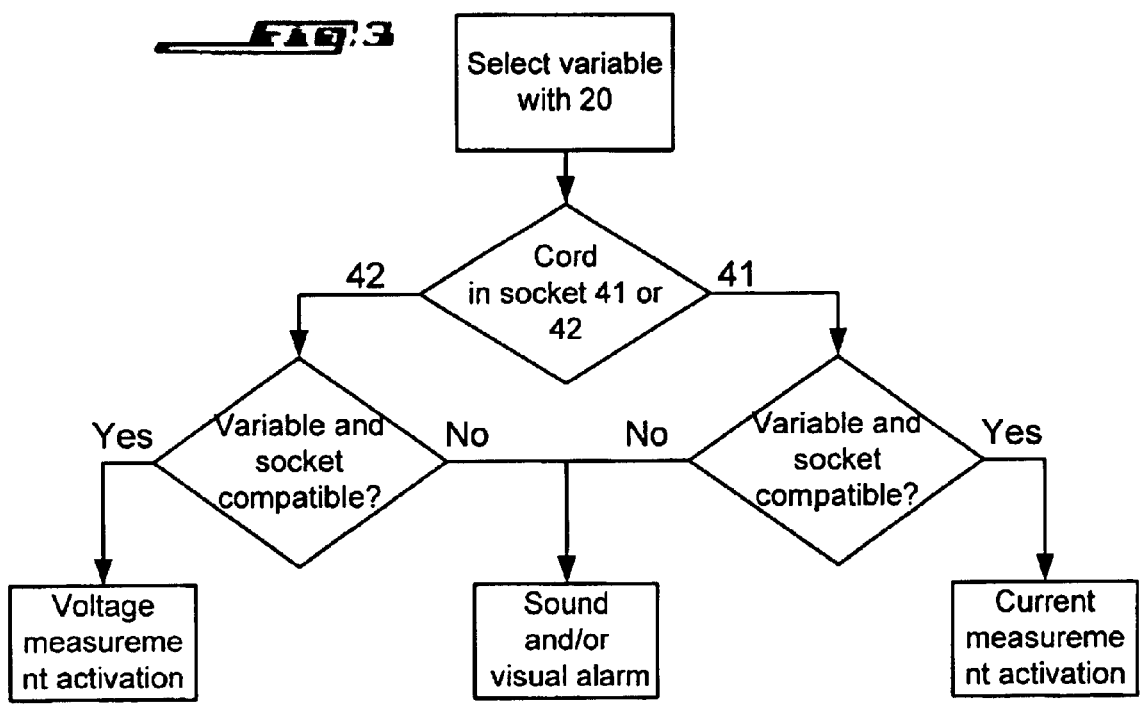
Figure 4:
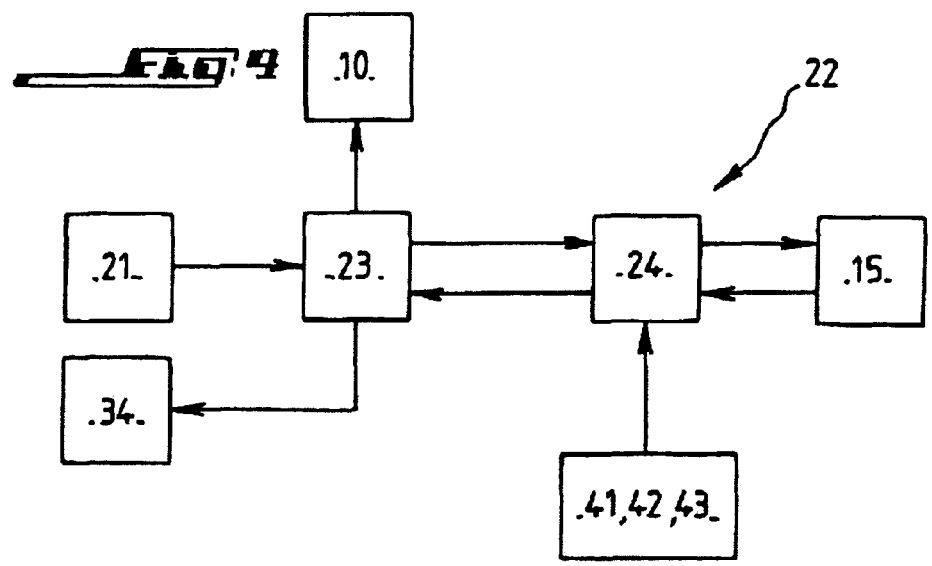

Other characteristics and advantages of the invention will emerge clearly from the description below on an indicative and in no way limiting basis, with reference to the appended figures, among which:

FIG. 1 is a front view of an embodiment of the instrument of the invention, without measurement cord, FIG. 2 is a schematic diagram of the connecting part of the measurement cord of the instrument of FIG. 1, FIG. 3 is an algorithm representing the logic of activating the measurement means, FIG. 4 is a schematic diagram describing the general architecture of the instrument, and FIG. 5 is a schematized front view of a multimeter instrument of the prior art.

DETAILED DESCRIPTION

The multimeter instrument of FIG. 1 is suitable for the measurement of a plurality of variables, which, in the embodiment of the invention described below, are distributed in six families: the current, voltage and frequency of an electrical signal, the electrical capacitance and resistance of an electric circuit and the temperature.

This instrument has screen 10 for display of the measurement results, a plurality of measurement means 15, each associated with a predetermined variable, and device 20 for selection of the variable to be measured.

According to the invention, selection device 20 has touch-sensitive zones 21 for selection of the variable to be measured, and a means 22 for activating the measuring means associated with the variable selected using touch-sensitive selection zones 21.

Touch-sensitive selection zones 21 are divided into two sub-groups: touch-sensitive family zones 211 and touch-sensitive menu zones F1 to F5.

Touch-sensitive family zones 211 allow one to select one of the six above-mentioned families of variables. There are six of these touch-sensitive family zones 211, and each is associated with a family of single variable, such as the current A or the voltage V.

The touch-sensitive menu zones F1 to F5, among other things, allow one to select the variable to be measured from a given family.

The instrument also has touch-sensitive zone 30 for starting/stopping the instrument and touch-sensitive zone 31 for general parameterization of the instrument, allowing adjustment of the internal clock, for example.

The six touch-sensitive family zones 211, touch-sensitive zone 30 for starting/stopping the instrument, and touch-sensitive zone 31 for general parameterization of the instrument, are arranged in a circle in imitation of a mechanical rotary switching device.

The touch-sensitive menu zones F1 to F5 are arranged immediately below display screen 10, and, besides the functions described above, allow adjustment of the measurement means selected using touch-sensitive selection zones 21.

The function of these zones F1 to F5 varies depending on the family of variables selected with the aid of touch-sensitive family zones 211. Indications on the function of each touch-sensitive menu zone F1 to F5 are generally indicated on display screen 10, immediately facing touch-sensitive menu zones F1 to F5.

In FIG. 1, the instrument is represented in the state in which the selected family of variables to be measured is the current. It is seen that in this case, touch-sensitive zone F1 is used for selecting an operating mode of the instrument suitable for AC, zone F2 for DC, zone F3 for mixed DC and AC signals, zone F4 for a mode of operation in which the instrument measures peak current, and zone F5 gives access to a menu for adjusting the scale of the measured values by modification of the gain.

In the case in which the selected family of variables to be measured is the voltage, touch-sensitive menu zones F1 to F5 keep the same functions as in the case in which the current is measured.

In the case in which the selected family of variables to be measured is the resistance, touch-sensitive selection zone F1 is used for selecting the electrical resistance variable, zone F2 for adjusting the sounds emitted by the instrument, zone F3 for selecting an operating mode of the instrument suitable for diode testing, zone F4 is inactive, and zone F5 gives access to a menu for adjusting the scale.

In the case in which the selected family of variables to be measured is the frequency, touch-sensitive menu zone F1 is used for selecting the frequency variable, zone F2 for the period variable, zone F3 for the number of pulses variable, zone F4 for the time variable, and zone F5 gives access to a menu for adjusting the scale. Zone F4 in fact gives access to a chronometer.

In the case in which the selected family of variables to be measured is the capacitance, zones F1 to F4 are inactive, zone F5 giving access to a menu for adjusting the scale.

In the case in which the selected family of variables to be measured is the temperature, zones F1 to F4 allow one to select operating modes of the instrument suitable for different types of temperature probes, zone F5 giving access to a menu for adjusting the scale.

When the touch-sensitive family zone 211 has been actuated, the instrument adopts by default the configuration accessible by touch-sensitive zone F1.

The instrument also has touch-sensitive functional zones 32 allowing one to activate functions of the instruments common to all the measurement means 15.

These functions are, for example, control of the measurement scale, consultation of the minima and maxima, display of the measurement result not as an absolute value but as a relative value with respect to a reference, the storage in memory of instantaneous values or else the possibility of freezing the screen at an instantaneous value.

The measurement scale is a predetermined order of magnitude, for example, $\mu A$, mA, or A in the case of current measurements, allowing the instrument to adopt a gain well suited to the current of the signal to be measured.

As shown in FIG. 1, display screen 10 has main display zone 11 in which the result of the measurement is displayed, and secondary display zone 12 which displays another result selected using touch-sensitive zone 33 for control of the contents of the display.

This touch-sensitive zone 33 for management of the contents of the display is arranged in the center of the circle formed by touch-sensitive family zones 211, touch-sensitive zone 31 for general parameterization, and touch-sensitive start/stop zone 30. The secondary parameter displayed in secondary display zone 12 of screen 10 can be, for example, the frequency of a current signal in the case of measuring the AC current.

Light indicators 34 are arranged in a circle around touch-sensitive family zones 211 and touch-sensitive zone 31 for general parameterization.

A light indicator 34 is associated with each of the above-mentioned touch-sensitive zones and is arranged in its immediate vicinity.

A lit light indicator 34 indicates either the family to which the variable currently measured by the instrument belongs, this family being that of the touch-sensitive zone 211 with which light indicator 34 is associated, or that the general parameterization menu is being used.

Light indicators 34 are light-emitting diodes known by the acronym LEDs.

The instrument has three input sockets Ampère 41, Volt 42 and Common 43 which are arranged on an upper side of the instrument, and measurement cord 44 electrically connected by connection end 45 to input socket Ampère 41 or to input socket Volt 42 as a function of the variable to be measured.

The measurement end of measurement cord 44, opposite its connection end, is electrically connected to a measurement probe or to the point at which one wishes to take a measurement, for example, a point of an electrical circuit.

Reference cord 46, electrically conductive, is electrically connected at one end to input socket Commun 43, and at the opposite end to a point of reference, for example, the ground of the electrical circuit one wishes to measure.

The general structure of the instrument is represented in FIG. 4.

Touch-sensitive family zones 21, stop/start zone 30, general parameterization zone 31, menu zones F1 to F5, functional zones 32, and zone 33 for control of the contents of the display are all contactors, for example, push-buttons, allowing one to position electromechanical or solid-state relays associated with them, where these relays are supported on an electronic card.

Activation means 22 includes microprocessor 23 which receives commands coming from the touch-sensitive zones and electronic switching circuit 24 which includes solid-state and electromechanical relays, connecting input sockets 41 to 43 to measurement means 15. The configuration of electronic switching circuit 24 is controlled by microprocessor 23 as a function of the commands coming from the touch-sensitive zones.

Each push-button allows one to send a command to microprocessor 50.

Light indicators 34 are controlled by microprocessor 50 which turns them on and off as a function of the control signals received from activation means 22.

Microprocessor 50 also ensures the control of display screen 10 and the automatic selection of the measuring scale as a function of the input signal.

The instrument has a means for detecting the connection of connecting end 45 of measurement cord 44 to input socket Ampère 41 or to input socket Volt 42.

For this purpose, each of input sockets Ampère 41 and Volt 42 has two half-sockets electrically isolated from one another, respectively, half-sockets Ampère 411 and Volts 421.

Connecting end 45 of the measurement cord is equipped with plug 48 which short-circuits the two half-sockets Ampère 411 when connecting end 45 of the cord is connected to input socket Ampère 41, and which short-circuits the two half-sockets Volt 421 when connecting end 45 of the cord is connected to input socket Volt 42.

The detection means detects the short-circuiting of the two half-sockets Ampère 411 or Volt 412 by comparing the potentials of the half-sockets of the same socket.

When the potentials of the two half-sockets Ampère 411 are equal, the cord is considered to be present in input socket Ampère 41. Likewise, when the potentials of the two half-sockets Volt 421 are equal, the cord is considered to be present in input socket Volt 42. The detection means sends this information to microprocessor 23.

As shown in FIG. 3, when a user selects a variable to be measured using selection device 20, microprocessor 23 tests whether measurement cord 44 is present in input socket Ampère 41 or in input socket Volt 42.

If the variable selected to be measured is compatible with the connection of measurement cord 44, then microprocessor 23 activates the corresponding measurement means.

Otherwise, the instrument issues a sound and/or visual alarm.

During the course of measurement, microprocessor 23 periodically tests whether suitability for use still exists between the position of the measurement cord in the sockets and the selected variable to be measured.

Thus, the means for measuring current will only be activated if measurement cord 44 is connected to input socket Ampère 41, and if the variable selected is current. Likewise, the means for measuring voltage will only be activated if measurement cord 44 is connected to input socket Volt 42, and if the variable selected is voltage.

This functionality of the instrument makes it possible to eliminate a common multimeter operating error, which consists of confusing voltage and current and selecting current using selection device 20 while the instrument is connected to a source of voltage. One would then risk seriously damaging it.

One of the two half-sockets 411 of input socket Ampère 41 is electrically connected to input socket Common 43 via series-connected main fuse F1 and secondary fuse F2.

Main fuse F1 is a high-capacity fuse, cutting off at 1000 V and 11 A. This fuse is expensive and difficult to procure.

Secondary fuse F2 is an ordinary, inexpensive fuse which cuts off at approximately 10 A and at a voltage of less than half the voltage at which main fuse F1 cuts off, for example, 250 V.

This secondary fuse F2, which is more sensitive than the main fuse, protects the main fuse since it will be destroyed before main fuse F1 in case of incorrect operation of the instrument.

This incorrect operation can consist, for example, of connecting measurement cord 44 to input socket Ampère 41, and connecting the measurement cord to a high voltage source. Fuse F2 will be destroyed, and Fuse F1 will be saved.

It should be noted that the instrument only has a single input socket Ampère, which makes it possible to have just one set of fuses and to save space.

It is indeed seen, therefore, that the instrument offers advantages, while maintaining the visual appearance to which the users are accustomed. The touch-sensitive zones, indeed, form a circle which recalls the traditional rotary mechanical selector, and, like the rotary selector, allows one to select the family of variable to be measured.

On the other hand, the instrument of the invention has the advantage that it can be completely remotely controlled, which makes it possible to calibrate it automatically without a mechanical actuator.

The structure of the instrument also allows one to carry out automatic observations, which consist of cyclically measuring different variables, switching from one to the other after a time delay.

Finally, it should be stressed that the instrument allows direct and rapid access to the main functions, which is not the case of instruments of the prior art.

FIG. 5 represents a part of the front of a measurement instrument of the prior art including rotary mechanical selector 70 and two selection buttons 71 and 72.

Selector 70 can assume twelve positions numbered 1 to 12 in FIG. 5, which can be accessed starting from position 1 by turning the selector in a predetermined direction which is represented by an arrow. The instrument is stopped when the selector is in position 1.

Table 1 compares the number of actions which are necessary, in the case of the instrument of the invention and in the case of the instrument of FIG. 5, in order to select a variable which is to be measured and to adjust the main parameters associated with this variable, such as the type of signal (alternating or direct) for current measurements, or the measurement scale. An action consists of pressing a touch-sensitive zone in the case of the invention and of turning the selector one position or pressing a button in the case of the instrument of FIG. 5.

This table shows that, on average, two actions are necessary to perform these operations with the instrument of the invention, and 6.4 actions are necessary with the instrument of FIG. 5. The instrument of the invention is therefore much more pleasant and user-friendly.

TABLE 1

| Variable | Parameters | Instrument of the invention Zone 211 | Instrument of the invention Menu zone | Prior art Number of positions | Difference in terms of number of actions |
|---|---|---|---|---|---|
| Voltage | Range V dc | 1 Pressing action | 1 Pressing action F2 | 3 | 1 |
|  | Range mV dc | 1 Pressing action | 1 Pressing action F2 | 4 | 2 |
|  | Range V ac | 1 Pressing action | — | 1 | 0 |
|  | Range mV ac | 1 Pressing action | — | 2 | 1 |
|  | Range V ac + dc | 1 Pressing action | 1 Pressing action F3 | 3 + Button 71 | 2 |
|  | Range mV ac + dc | 1 Pressing action | 1 Pressing action F3 | 4 + Button 71 | 3 |
| Resistance |  | 1 Pressing action | — | 5 | 4 |
| Capacitance |  | 1 Pressing action | — | 6 | 5 |
| Diode testing |  | 1 Pressing action | 1 Pressing action F3 | 6 + Button 71 | 5 |
| Frequency |  | 1 Pressing action | — | 3 + Button 72 | 3 |
| Current | Range A ac | 1 Pressing action | — | 8 | 7 |
|  | Range $\mu$A ac | 1 Pressing action | — | 9 | 8 |
|  | Range A dc | 1 Pressing action | 1 Pressing action F2 | 10 | 8 |
|  | Range $\mu$A dc | 1 Pressing action | 1 Pressing action F2 | 11 | 9 |
|  | Range A ac + dc | 1 Pressing action | 1 Pressing action F3 | 10 + Button 71 | 9 |
|  | Range $\mu$A ac + dc | 1 Pressing action | 1 Pressing action F3 | 11 + Button 71 | 10 |

Another advantage of the instrument is that it does not have moving parts such as a rotary selector or parts that rub, and that it therefore wears out very slowly. It is therefore very reliable.

Finally, the use of the selection device only requires one hand, since it is sufficient to press the touch-sensitive zones with a finger. This operating mode is easy and fast. The instrument is preferably portable but can be stationary. Its dimensions are comparable to those of a portable multimeter that is conventionally used for checking electric circuits and that include a rotary mechanical selector.

What is claimed is:

1. A multimeter instrument for measuring a plurality of variables, the instrument comprising:
    a plurality of measurement means, each measurement means being associated with a respective variable,
    a device for selection of the variable to be measured, and having touch-sensitive zones for selection of the variable to be measured,
    a plurality of input sockets,
    means for activating the measurement means associated with the variable selected and including
        touch-sensitive selection zones,
        a microprocessor, and
        a switching circuit connecting the input sockets to the measurement means and controlled by the microprocessor as a function of commands from the touch-sensitive selection zones, wherein each touch-sensitive selection zone includes means for activating the microprocessor.

2. The instrument according to claim 1, wherein the variables are subdivided into several families, the touch-sensitive selection zones comprise touch-sensitive family zones for selection of a family of variables, and touch-sensitive menu zones for selection of a variable within a family.

3. A multimeter instrument for measuring a plurality of variables the instrument comprising:
    a plurality of measurement means, each measurement means being associated with a respective variable,
    a device for selection of the variable to be measured, and having touch-sensitive zones for selection of the variable to be measured,
    means for activating the measurement means associated with the variable selected and including touch-sensitive selection zones,
    a plurality of input sockets,
    means of measuring electrical current,
    a current input socket used when the means of measuring electrical current is selected,
    a measurement cord selectively connectable at a connecting end to one of the sockets, and
    means for detecting connection of the connecting end of the cord to the current input socket, wherein
        the current input socket has two half-sockets electrically isolated from one another,
        the connecting end of the cord includes a plug for short-circuiting the two half-sockets when the connecting end of the cord is connected to the current input socket,
        the detection means detects the short-circuiting of the two half-sockets,
        the means for activating the measuring means includes a microprocessor, and
        each touch-sensitive selection zone includes means for activating the microprocessor.

4. A instrument for measurement a plurality of variables, the instrument comprising:
    a plurality of measurement means, each measurement means being associated with a respective variable,
    a device for selection of the variable to be measured, and having touch-sensitive zones for selection of the variable to be measured,
    means for activating the measurement means associated with the variable selected and including touch-sensitive selection zones,
    a plurality of input sockets,
    means of measuring electrical current,
    a current input socket used when the means of measuring electrical current is selected,
    a measurement cord selectably connectable at a connecting end to one of the sockets, and
    means for detecting connection of the connecting end of the cord to the current input socket, wherein
        the means for activating the measuring means automatically activates the means of measuring electrical current when the detection means detects the connection of the connecting end of the cord to the current input socket and current was selected by the device for selection, the means for activating the measuring means includes a microprocessor, and each touch-sensitive selection zone includes means for activating the microprocessor.

5. The instrument according to claim 3, wherein one of the two half-sockets of the current input socket can be electrically connected to a reference input socket via a series-connected main fuse and secondary fuse, the secondary fuse being opened at a voltage no more than half the voltage opening the main fuse.

6. The instrument according to claim 2, wherein the touch-sensitive family zones are arranged in a circle.

7. The instrument according to claim 6, comprising light indicators arranged in a circle proximate the touch-sensitive family zones, for indicating the family to which the variable selected by the means for activating the measurement means corresponds.

8. The instrument according to claim 1, wherein the touch-sensitive family zones are arranged in a circle.

9. The instrument according to claim 8, comprising light indicators arranged in a circle proximate the touch-sensitive family zones, for indicating the family to which the variable selected by the means for activating the measurement means corresponds.

10. The instrument according to claim 3, wherein the means for activating the measuring means automatically activates the means of measuring electrical current when the detection means detects the connection of connecting end of the cord to the current input socket and that current was selected by the selection device.

11. The instrument according to claim 3, wherein the touch-sensitive family zones are arranged in a circle.

12. The instrument according to claim 11, comprising light indicators arranged in a circle proximate the touch-sensitive family zones, for indicating the family to which the variable selected by the means for activating the measurement means corresponds.

13. The instrument according to claim 4, wherein the current input socket has two half-sockets electrically isolated from one another, and one of the two half-sockets can be electrically connected to a reference input socket via a series-connected main fuse and secondary fuse, the secondary fuse being opened at a voltage no more than half the voltage opening the main fuse.

14. The instrument according to claim 4, wherein the touch-sensitive family zones are arranged in a circle.

15. The instrument according to claim 14, comprising light indicators arranged in a circle proximate the touch-sensitive family zones, for indicating the family to which the variable selected by the means for activating the measurement means corresponds.

* * * * *